US008037845B2

(12) United States Patent
Sjöblom

(10) Patent No.: US 8,037,845 B2
(45) Date of Patent: Oct. 18, 2011

(54) DETECTING ARRANGEMENT AND METHOD FOR A MAGNETIC GRIPPER DEVICE

(75) Inventor: Krister Sjöblom, Ösmo (SE)

(73) Assignee: Delaval Holding AB, Tumba (SE)

( * ) Notice: Subject to any disclaimer, the term of this patent is extended or adjusted under 35 U.S.C. 154(b) by 355 days.

(21) Appl. No.: 11/990,781

(22) PCT Filed: Aug. 29, 2006

(86) PCT No.: PCT/SE2006/000987
§ 371 (c)(1),
(2), (4) Date: Apr. 17, 2008

(87) PCT Pub. No.: WO2007/027137
PCT Pub. Date: Mar. 8, 2007

(65) Prior Publication Data
US 2009/0102477 A1 Apr. 23, 2009

(30) Foreign Application Priority Data

Sep. 2, 2005 (SE) ........................................ 0501948

(51) Int. Cl.
*A01J 5/00* (2006.01)
(52) U.S. Cl. .................................. 119/14.14; 119/14.08
(58) Field of Classification Search ............... 119/14.01, 119/14.02, 14.03, 14.08, 14.14, 14.18; 324/260
See application file for complete search history.

(56) References Cited

U.S. PATENT DOCUMENTS

| 4,647,268 | A | | 3/1987 | Scholl | |
|---|---|---|---|---|---|
| 5,042,428 | A | * | 8/1991 | Van der Lely et al. | 119/14.08 |
| 5,264,733 | A | | 11/1993 | Tigges | |
| 5,471,445 | A | | 11/1995 | Emberty et al. | |
| 5,784,994 | A | * | 7/1998 | van der Lely | 119/14.08 |
| 5,842,436 | A | * | 12/1998 | van der Lely | 119/14.08 |
| 5,865,138 | A | * | 2/1999 | van der Lely | 119/14.02 |
| 6,116,188 | A | * | 9/2000 | van der Lely | 119/14.02 |
| 6,575,116 | B1 | * | 6/2003 | Birk et al. | 119/14.48 |

FOREIGN PATENT DOCUMENTS

DE   198 21 462 A1   11/1999

(Continued)

OTHER PUBLICATIONS

Search report for corresponding European Patent Application No. EP 06 78 4120 dated Aug. 5, 2010.

*Primary Examiner* — T. Nguyen
(74) *Attorney, Agent, or Firm* — Harness, Dickey & Pierce, P.L.C.

(57) ABSTRACT

A detecting arrangement for a magnetic gripper device (3) mountable on a robot arm (10) of a milking robot (2) provided for automatically attaching teat cups (5) to the teats of a milking animal, wherein the magnetic gripper device is adapted for gripping teat cups made of or comprising a magnetic material and comprises a primary coil (31) feedable with a current and a core (33) of a magnetic material arranged at least partly within the primary coil. The detecting arrangement comprises means (41, 43; 43; 53) for repetitively sensing a magnetic field, an inductance, or a change thereof, as caused by a teat cup (5) when being present at, or gripped by, the magnetic gripper device (3); and means (44; 54) for repetitively detecting whether the magnetic gripper device is holding a teat cup or not based on said repetitive sensing of the magnetic field, the inductance, or the change thereof.

18 Claims, 4 Drawing Sheets

FOREIGN PATENT DOCUMENTS

| | | |
|---|---|---|
| DE | 103 55 003 A1 | 6/2005 |
| EP | 0551956 | 7/1993 |
| EP | 0774203 | 5/1997 |
| WO | 96/07314 | 3/1996 |
| WO | 00/72665 | 12/2000 |
| WO | WO 00/72665 | 12/2000 |
| WO | 2005/122753 | 12/2005 |

\* cited by examiner

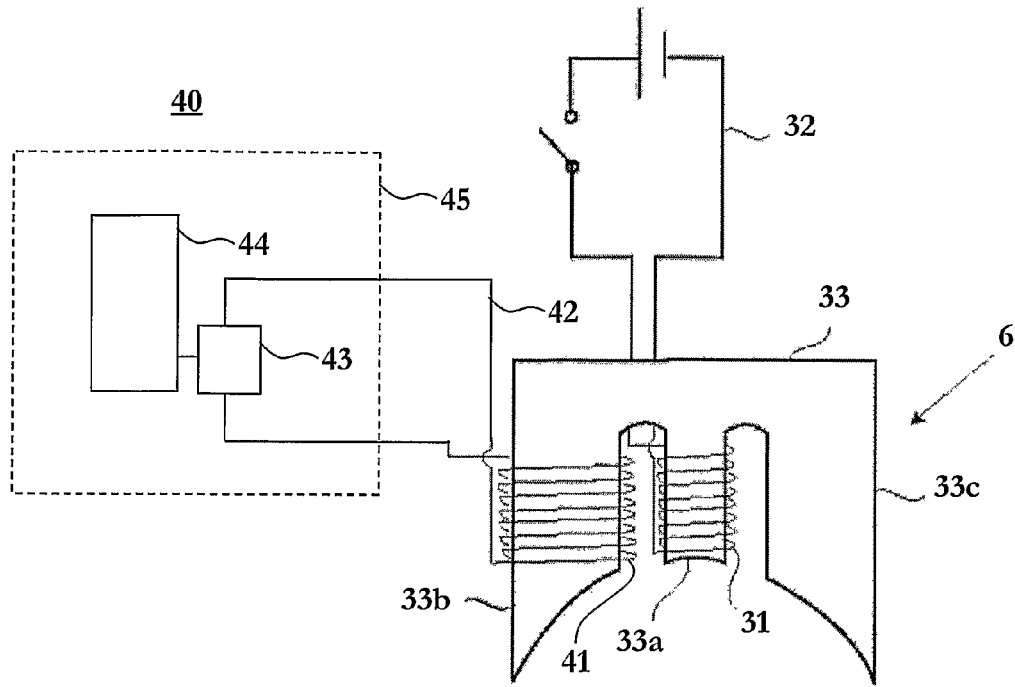
Fig. 2
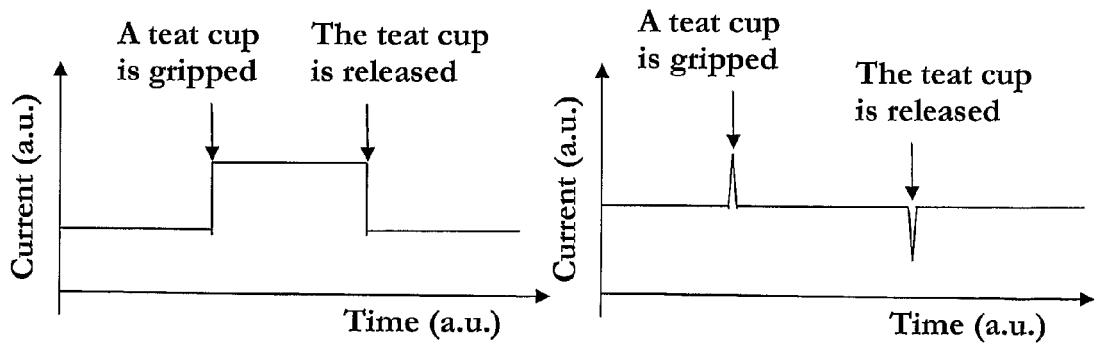
Fig. 3a  Fig. 3b

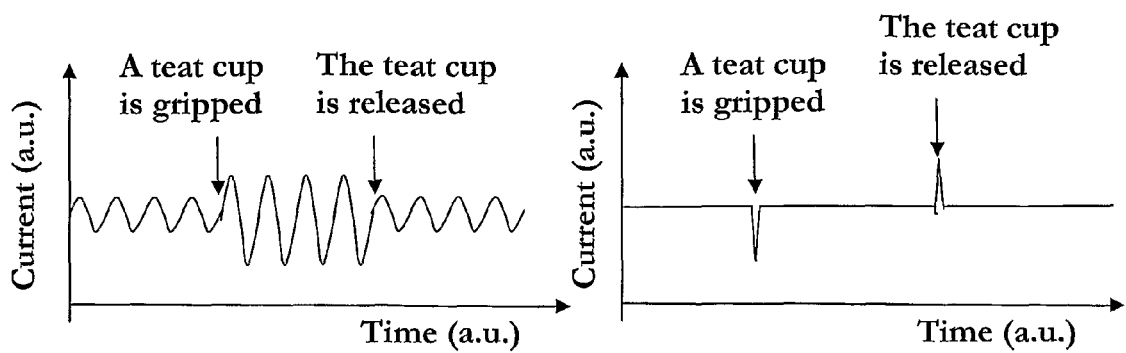
Fig. 6a     Fig. 6b
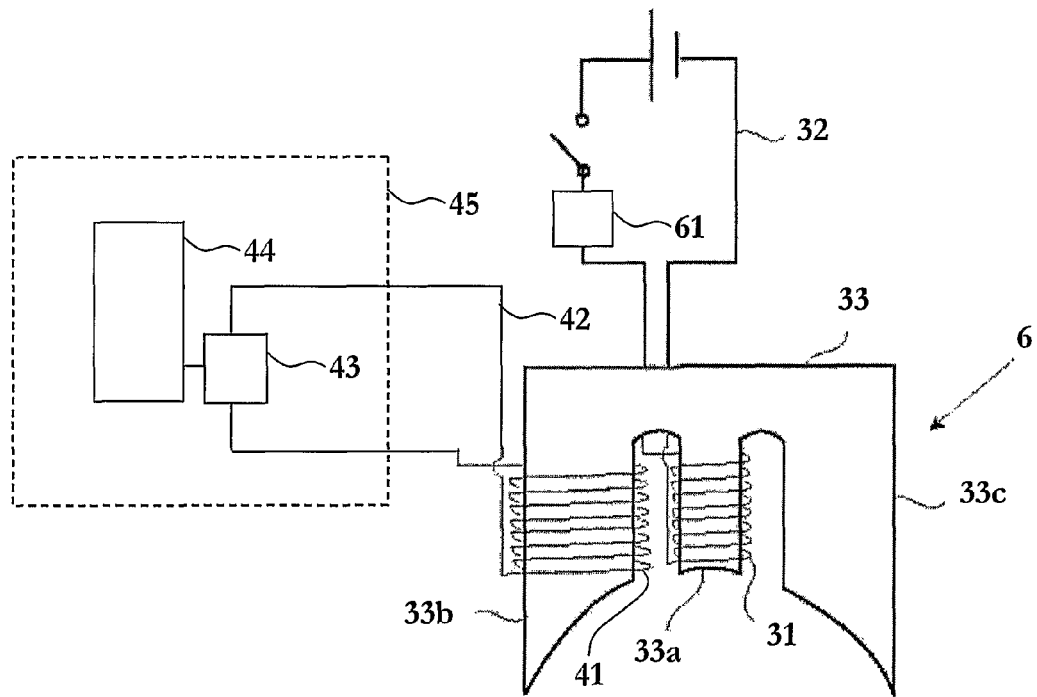
Fig. 7

DETECTING ARRANGEMENT AND METHOD FOR A MAGNETIC GRIPPER DEVICE

TECHNICAL FIELD OF THE INVENTION

The present invention generally relates to the field of animal arrangements, preferably but not exclusively intended for cows, and more specifically the invention relates to detecting arrangements and methods according to the preambles of the appended independent patent claims.

DESCRIPTION OF RELATED ART

Electromagnets may be used for gripping and holding parts made of a magnetic material.

WO 00/72665 A1 (DELAVAL), EP 0 551 956 A1 (VAN DER LELY), and WO 96/07314 (MAASLAND) disclose the use of electromagnets in gripper devices for milking robots. The gripper devices are used for gripping teat cups and attaching them to the teats of a cow.

A typical gripper device comprises an electromagnet for gripping, and a support structure for holding the electromagnet. The electromagnet includes a coil feedable with a current and a core of a magnetic material arranged at least partly within the coil. A face of the core is engagable with parts to be gripped.

At times it is important to know if a gripper device is actually holding something or not. For this purpose optical or inductive sensors may be provided in the face of the gripper to optically or electrically sense whether the gripper is holding something or not.

In mechanical gripper devices for milking robots an inductive sensor has typically been applied for this purpose. Other kind of sensors, e.g. micro-switches, conductivity sensors, clinometers, are disclosed in EP 0 774 203.

SUMMARY OF THE INVENTION

In hazardous and aggressive environments, such as in a milking barn, sensors of the above kind may easily get out of order due to soiling, damages, and the like.

It is therefore an object of the present invention to provide a detecting arrangement and a detecting method, respectively, capable of detecting whether a magnetic gripper device is holding a teat cup or not, which lack the above-identified problems associated with the prior art.

This object, among others, is according to the present invention attained by detecting arrangements and methods as specified in the appended claims.

By repetitively sensing by a sensor or measuring unit a magnetic field or an inductance, or a change thereof, as caused by the presence of a teat cup at, or a teat cup being gripped by, the magnetic gripper device, and by repetitively detecting by a detector whether the magnetic gripper device is holding a teat cup or not, no sensor has to be mounted in the face of the gripper device, which faces a teat cup when being gripped by the magnetic gripper device. The sensor may, to the contrary, be arranged remote from the face of the gripper device and may be covered or encapsulated to protect it from soil and dirt.

Conveniently, the inductance in the coil, referred to as a primary coil, of the magnetic gripper device is affected by a change in the magnetic field as caused by the presence of the teat cup, and is measured as a current or voltage. Thus, the energy consumption by the gripper device can be monitored and used for detection of presence of a teat cup in the gripper device.

The sensor and the detector may be implemented in any manner known or conceivable by a person skilled in the art. Preferably though, the current is repetitively measured, and each measured value is fed to dedicated electronics or to a computer, which may constitute or be part of a central processing device for the overall control of the milking robot or of an entire milking station or arrangement comprising the milking robot.

The detecting arrangement may not only be located remote from the face of the gripper device, but may also perform the measurements non-intrusively and in a non-contacting manner. The detecting arrangement is simple and robust and comprises typically no moving parts.

According to one embodiment the detecting arrangement comprises a secondary coil, in which a current is induced and repetitively measured, and the measurement values are transferred to the detector. Hereby, the detecting arrangement may be provided separate from the circuit of the gripper device.

According to a further embodiment of the detecting arrangement the current is directly measured in the circuit including the primary coil used in the electromagnet of the gripper device, and the measurement values are transferred to the detector. This embodiment provides a simple and straight-forward solution.

According to yet a further embodiment the detecting arrangement comprises a Hall-effect sensor connected to the detector. The Hall-effect sensor may be located far from the gripping face to measure the induced voltage across a thin plate as caused by a current flowing along the plate, while a magnetic field is applied across the plate, but orthogonal to the induced voltage.

The magnetic gripper device may be fed by AC or DC current.

In the former case it is quite simple and straight-forward to establish whether the gripper device is holding a teat cup or not by simply measuring the amplitude of the signal and by comparing the measured signal amplitude with a predetermined threshold value. Typically, if the measured signal amplitude is larger than the threshold value it is established that the gripper device holds a teat cup, and if the measured signal amplitude is smaller than the threshold value it is established that the gripper device does not hold a teat cup.

If the gripper device is fed with DC current it is typically only possible to sense the instantaneous moments when the gripper device grips and releases a teat cup. At these moments a current impulse is measured, and by detecting whether the current pulse is positive or negative it can be established whether the gripper device grips or releases a teat cup, and from this it can be established whether the gripper device holds a teat cup or not.

Alternatively, according to a still further embodiment of the present invention, an H-bridge or other device known in the art may be provided for forming a current having a periodically varying amplitude from the DC current feeding. This periodically varying current is fed to the coil of the electromagnet of the gripper device, and the presence of a teat cup at the gripper device can be measured in a similar manner as when the coil of the electromagnet of the gripper device is fed with AC current.

Yet further objects of the invention are to provide a milking robot and a milking robot arm, respectively, each of which being equipped with a magnetic gripper device and a detecting arrangement, which fulfills the above object.

These objects are attained by a milking robot and a milking robot arm, respectively, as specified in the appended claims.

Further characteristics of the invention, and advantages thereof, will be evident from the following detailed description of preferred embodiments of the present invention given hereinafter and the accompanying FIGS. 1-7, which are given by way of illustration only, and shall thus not limit the scope of the present invention.

BRIEF DESCRIPTION OF THE DRAWINGS

FIG. 2 illustrates, in a schematic side view, the magnetic gripper device with the detecting arrangement as being comprised in the milking robot of FIG. 1.

FIGS. 3a-b are current diagrams for a magnetic gripper device operated with AC and DC currents, respectively, during gripping of a teat cup by the magnetic gripper device as detected by the detecting arrangement of FIG. 2.

FIGS. 6a-b are current diagrams for a magnetic gripper device operated with AC and DC currents, respectively, during gripping of a teat cup by the magnetic gripper device as detected by the detecting arrangement of FIG. 5.

FIG. 7 illustrates, in a schematic side view, a DC feed magnetic gripper device with a detecting arrangement according to still another embodiment of the present invention.

DETAILED DESCRIPTION OF EMBODIMENTS

Figure 1:
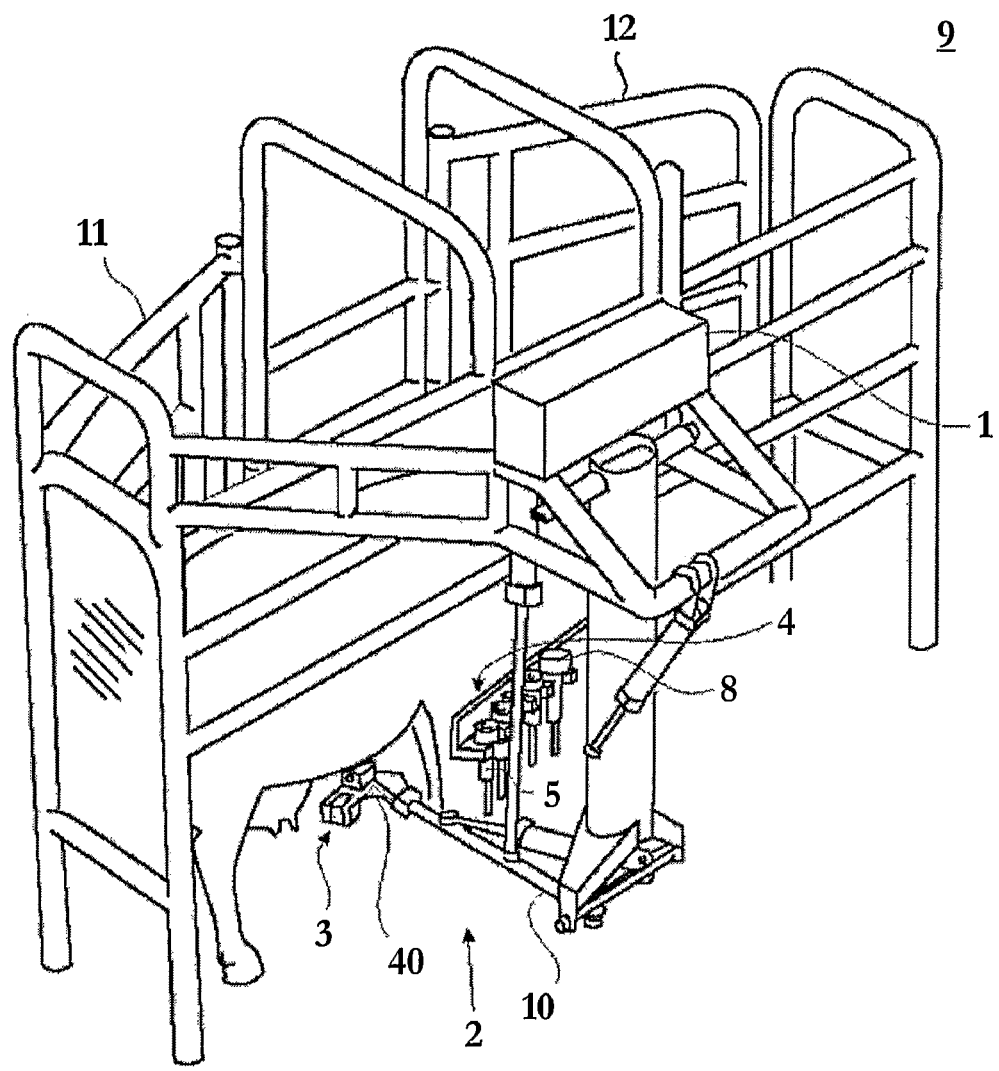
FIG. 1 illustrates, in a perspective view, a milking station comprising a milking robot including a magnetic gripper device with a detecting arrangement according to an embodiment of the present invention.

In FIG. 1 is shown a milking system or station arranged for voluntary milking of freely walking animals such as e.g. cows, i.e. the animals enter the milking station 9 in order to be milked on a voluntary basis. The milking station 9 comprises an enclosure having an inlet gate 11 and an outlet gate 12.

An automatic milking machine (not explicitly illustrated) is provided for milking the cows. The automatic milking machine includes teat cups 5 connected to an end unit by means of milk lines (only the portions attached to the teat cups 5 are shown in FIG. 1).

A milking robot or automatic handling device 2 having a robot arm 10 equipped with a magnetic gripper device 3 in its far end is provided to automatically fetch the teat cups 5 of the milking machine from a rack 4, wherein the teat cups 5 are stored, to move them toward the udder of the cow, and to attach them to the teats of the cow. Typically the teat cups 5 are fetched, moved and attached one at a time. However, they may alternatively be fetched, moved and attached two or all at a time.

The milking robot 2 is typically equipped with a camera system or other detecting device for determining the exact positions of the teats, to which the teat cup 5 are to be attached.

A teat cleaning device including e.g. a teat cleaning cup 8 may be provided for cleaning the teats of the cow in a sequential order prior to milking. The teat cleaning cup 8 may be stored in the rack 4 or in a separate magazine, and may be fetched, moved toward the udder of the cow, and attached to the teats of the cow by the milking robot 2.

Further, the milking station 9 comprises an identification member provided to identify a cow approaching the milking station 9, and a central processing and control device 1, which is responsible for central processing and controlling of the milking station, which inter alia includes the initiation of various activities in connection with the milking such as e.g. opening and closing of the gates 11 and 12, and control of the milking machine and the milking robot 2. The central processing and control device 1 comprises typically a microcomputer, suitable software, and a database including information of each of the cows milked by the milking machine, such as e.g. when the respective cow was milked last time, when she was fed last time, her milk production, her health, etc.

Still further, the milking robot 2 is in accordance with the present invention equipped with a detecting arrangement 40 for repetitively detecting whether the magnetic gripper device is holding a teat cup or not.

The detecting arrangement 40 and the magnetic gripper device 3 are illustrated more in detail in FIG. 2.

The magnetic gripper device 3 of the robot arm, which is intended to grip, hold, and release the teat cups 5 and the teat cleaning cup 8, comprises an electromagnet 6 provided for gripping the teat cups 5. To this end the teat cups 5 have to be made of or comprise a magnetic material. A support structure (not illustrated), which is mountable to the robot arm 10, is provided for holding the electromagnet 6.

The electromagnet 6 includes a primary coil 31 feedable with a current by a first electric circuit 32 and a core 33 of a magnetic material, e.g. iron or steel, arranged at least partly within the primary coil 31. The core 33 of the electromagnet 6 comprises end portions 33a-c in a single face of the electromagnet 6, wherein the end portions 33a-c constitute different poles of the electromagnet 6 and are shaped to be engagable with each of the teat cups 5 in a close fit, and optionally also engagable with the teat cleaning cup 8 in a close fit.

The detecting arrangement 40 of the present invention comprises a secondary coil 41 wound around the end portion 33b of the core 33 and connected to a second electric circuit 42. A measuring device 43 is provided for repetitively measuring an induced current in the second electric circuit 42 which induced current is directly related to the current in the primary coil 31, which in turn depends on the inductance in the primary coil 31 as caused by the magnetic field change due to the presence of a teat cup in the magnetic circuit formed by the core 33 and the teat cup connecting the south and north poles of the core 33. A detector device 44 is provided for receiving the measured current values, and for repetitively establishing whether a teat cup is held or not by the magnetic gripper device 3.

The measuring device 43 and the detector device 44 may be implemented in any manner known by a person skilled in the art. The measuring device 43 is preferably a device for non-intrusive and non-contacting measurements. The detector device 44 may be connected to the central processing and control device 1, or may constitute an integral part of the central processing and control device 1.

The measuring device 43 may be located remote from the single face of the magnetic gripper device 3, which comes into contact with a teat cup when being gripped by the magnetic gripper device 3, to thereby avoid the potentially aggressive environment the face of the gripper device comes into contact with. Further, a cover, schematically indicated by the dashed line 45, may be provided to cover the measuring device 43 and optionally the detector device 44 and hence protect these devices from soil and dirt.

FIGS. 3*a*-*b* are current diagrams for a magnetic gripper device operated with AC (FIG. 3*a*) and DC (FIG. 3*b*) currents during gripping and release of a teat cup by the magnetic gripper device 3 as sensed by the detecting arrangement of FIG. 2.

If AC current is used the amplitude of the current in the secondary coil 41 is increased as a step function when a teat cup is being gripped, and the current is decreased firstly when the teat cup is being released from the gripper device as being illustrated in FIG. 3*a*. The detector device 44 may, at each instant, determine whether the magnetic gripper device is holding a teat cup or not by comparing the last measured current value with a threshold value lying between the two current levels in FIG. 3*a*.

If DC current is used the amplitude of the current in the secondary coil 41 is momentarily increased as an impulse function when a teat cup is being gripped, and is momentarily decreased as an impulse function when the teat cup is being released from the gripper device as being illustrated in FIG. 3*b*. Since the steady current level is not shifted, the above detecting method may not be performed. Instead, by detecting whether each current impulse is positive (increasing) or negative (decreasing) it can be established whether the gripper device grips or releases a teat cup, and from this it can at each instant be established whether the gripper device is holding a teat cup or not.

Figure 4:
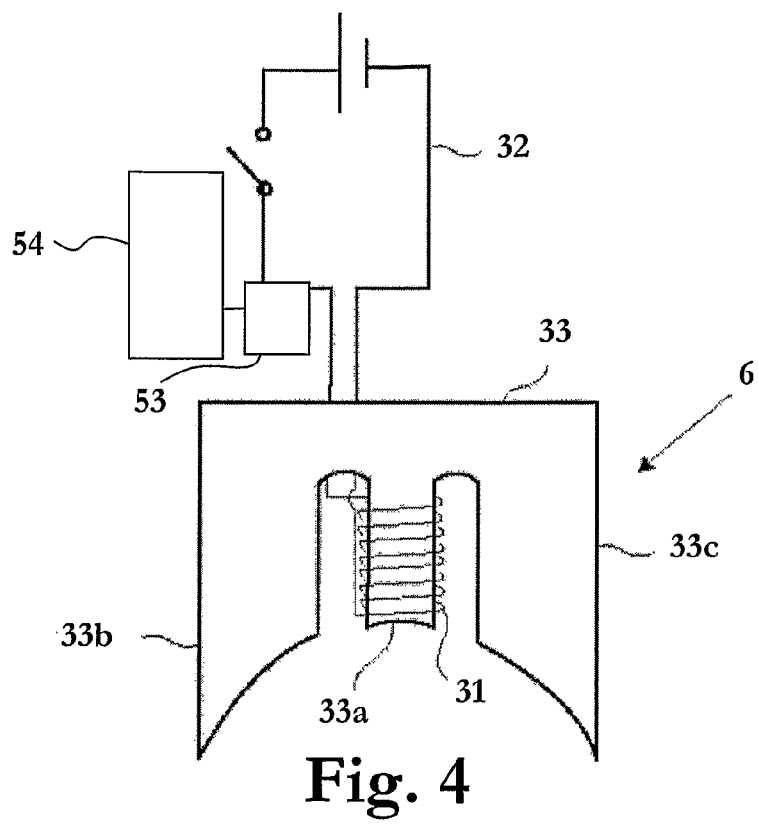
FIG. 4 illustrates, in a schematic side view, a magnetic gripper device with a detecting arrangement according to another embodiment of the present invention.

FIG. 4 illustrates, in a schematic side view, a magnetic gripper device with a detecting arrangement according to another embodiment of the present invention. The detecting arrangement comprises a Hall-effect sensor 53, and a detector device 54. The Hall-effect sensor 53 may be fed by current from the first electric circuit 32, but alternatively, the Hall-effect sensor has a separate current feeding and measures only the change in the magnetic field caused by the presence of a teat cup in the grip of the gripper device. The Hall-effect sensor 53 measures repeatedly the induced voltage and outputs to the detector device 54 high and low signals depending on the induced voltage values. The detector device 54 establishes then repeatedly whether the magnetic gripper device is holding a teat cup or not based on the outputs from the Hall-effect sensor.

Figure 5:
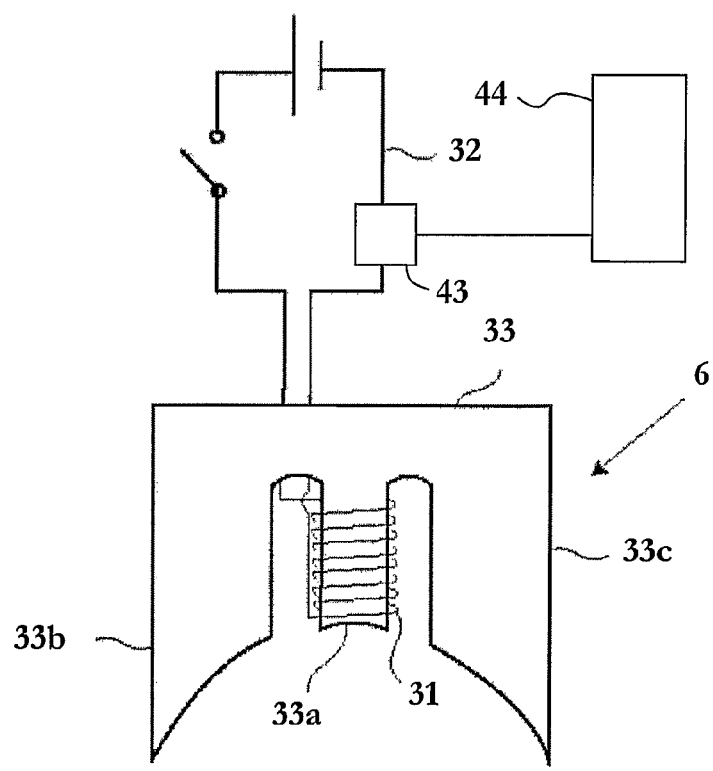
FIG. 5 illustrates, in a schematic side view, a magnetic gripper device with a detecting arrangement according to yet another embodiment of the present invention.

FIG. 5 illustrates, in a schematic side view, a magnetic gripper device with a detecting arrangement according to yet another embodiment of the present invention. This embodiment differs from the embodiment of FIG. 2 only in that the measuring device 43 measures the current in the primary coil 31, and the secondary coil 41 and the second circuit may thus be dispensed with.

FIGS. 6*a*-*b* are current diagrams for a magnetic gripper device operated with AC and DC currents, respectively, during a gripping and a subsequent release of a teat cup by the magnetic gripper device as detected by the detecting arrangement of FIG. 5.

When AC current is fed to the electromagnet of the gripper device, the difference in current is easily detectable. The amplitude of the current is heavily affected by the inductance as caused by a change in the magnetic field in presence of the teat cup. When DC current is fed to the electromagnet of the gripper device, the gripping and the releasing of the electromagnet gripper can be detected as small and short current pulses. The detection may be effectuated in a similar manner as being disclosed with reference to FIGS. 3*a*-*b* for the embodiment of FIG. 2.

FIG. 7 illustrates, in a schematic side view, a DC feed magnetic gripper device with a detecting arrangement according to still another embodiment of the present invention. The detecting arrangement is similar to the detecting arrangement of FIG. 2, but comprises a H-bridge or other device known in the art, over which the DC current is fed to the electromagnet of the gripper device. Hereby, the gripper device feeding is effectively an AC current superimposed on top of a DC current, and the detection may be performed similar to the detection as being disclosed with reference to FIG. 3*a*.

It will be obvious that the invention may be varied in a plurality of ways. Such variations are not to be regarded as a departure from the scope of the invention. All such modifications as would be obvious to one skilled in the art are intended to be included within the scope of the appended claims.

It shall particularly be stressed that features of the above disclosed embodiments may be combined to form still further embodiments of the present invention.

The invention claimed is:

1. A detecting arrangement for a magnetic gripper device mountable on a robot arm of a milking robot provided for automatically attaching teat cups to teats of a milking animal, wherein the magnetic gripper device is adapted for gripping teat cups made of or including a magnetic material and having a primary coil feedable with a current and a core of a magnetic material arranged at least partly within the primary coil, said detecting arrangement comprising:
   a device for repetitively measuring at least one of a magnetic field and an inductance, and determining a change of measurement of the least one of the magnetic field and the inductance when a teat cup is present at, or gripped by, the magnetic gripper device; and
   a device for repetitively detecting whether the magnetic gripper device is holding a teat cup or not based on said repeated measurement of the at least one of the magnetic field and the inductance.

2. The detecting arrangement of claim 1, wherein the measuring device is adapted to measure the change of measurement as a current.

3. The detecting arrangement of claim 1, wherein the measuring device is located remotely from a face of said magnetic gripper device which faces a teat cup when being gripped by said magnetic gripper device.

4. The detecting arrangement of claim 1, further comprises a cover for protecting the measuring device from soil and dirt.

5. The detecting arrangement of claim 1, wherein the device for repetitively sensing is a device for non-intrusive and/or non-contacting measurements.

6. The detecting arrangement of claim 1, wherein the device for repetitively sensing comprises a secondary coil and is adapted to sense the magnetic field, the inductance, or the change thereof as a current, or change thereof, in said secondary coil.

7. The detecting arrangement of claim 1, wherein the device for repetitively sensing is adapted to sense the magnetic field, the inductance, or the change thereof as a current, or change thereof, in said primary coil.

8. The detecting arrangement of claim 1, wherein the device for repetitively sensing comprises a Hall-effect sensor.

9. The detecting arrangement of claim 1, wherein said magnetic gripper device is fed by AC current; and said detecting device is adapted to detect, at each instant, whether the magnetic gripper device is holding a teat cup or not based on the last repeated measurement of the at least one of the magnetic field and the inductance.

10. The detecting arrangement of claim 1, wherein said magnetic gripper device is fed by DC current; and said detecting device is adapted to detect, at each instant, whether the magnetic gripper device is holding a teat cup or not based on the last repeated measurement of the at least one of the magnetic field and the inductance, and on an earlier detection of whether the magnetic gripper device is holding a teat cup or not.

11. The detecting arrangement of claim 1, wherein said magnetic gripper device is fed by DC current; and said detecting arrangement comprises a current shaping device, preferably an H-bridge, over which said magnetic gripper device is fed, wherein said current shaping device is adapted to form a current having a periodically varying amplitude from the DC current feeding; and said device for repetitively detecting is adapted to detect, at each instant, whether the magnetic gripper device is holding a teat cup or not based on the last one of the repetitively sensed magnetic field, inductance, or change thereof.

12. A milking robot arm equipped with a magnetic gripper device provided for automatically attaching teat cups to the teats of a milking animal, wherein the magnetic gripper device is adapted for gripping teat cups made of or including a magnetic material and having a primary coil feedable with a current and a core of a magnetic material arranged at least partly within the primary coil, and wherein said milking robot arm includes a detecting arrangement having a device for repetitively measuring at least one of a magnetic field and an inductance and determining a change of measurement of the least one of the magnetic field and the inductance when a teat cup is present at or gripped by the magnetic gripper device and a device for repetitively detecting whether the magnetic gripper device is holding a teat cup or not based on said repeated measurement of the at least one of the magnetic field and the inductance.

13. The milking robot arm of claim 12, wherein the core comprises two end portions in a single face of the electromagnet wherein the two end portions constitute different poles of the electromagnet, and are shaped to be engagable with the teat cups in a close fit.

14. A milking robot comprising the milking robot arm of claim 12.

15. A detecting method for a magnetic gripper device mountable on a robot arm of a milking robot provided for automatically attaching teat cups to teats of a milking animal, wherein the magnetic gripper device is adapted for gripping teat cups made of or including a magnetic material and having a primary coil feedable with a current and a core of a magnetic material arranged at least partly within the primary coil, the detecting method comprising:
  repetitively measuring at least one of a magnetic field and an inductance, and determining a change of measurement of the least one of the magnetic field and the inductance when a teat cup is present at, or gripped by, the magnetic gripper device; and
  repetitively detecting whether the magnetic gripper device is holding a teat cup or not based on the repeated measurement of at least one of the magnetic field and the inductance.

16. The detecting method of claim 15, further comprising measuring the change of measurement as a current.

17. The detecting method of claim 15, further comprising:
  remotely measuring the at least one of the magnetic field and the inductance from a face of said magnetic gripper device which faces a teat cup when being gripped by said magnetic gripper device.

18. The detecting method of claim 15, further comprising:
  closely fitting two end portions of the core in a single face of the electromagnet to the teat cups, wherein the two end portions constitute different poles of the electromagnet.

* * * * *